United States Patent [19]
Ohnuma

[11] Patent Number: 6,160,370
[45] Date of Patent: Dec. 12, 2000

[54] SAFETY DEVICE FOR AUTOMOBILE POWER WINDOW SYSTEM

[75] Inventor: Keizo Ohnuma, Tokyo, Japan

[73] Assignee: Oki Electric Industry Co., Ltd., Tokyo, Japan

[21] Appl. No.: 09/315,059

[22] Filed: May 20, 1999

[30] Foreign Application Priority Data

May 26, 1998 [JP] Japan ................................. 10-144370

[51] Int. Cl.⁷ ...................................................... G05B 5/00
[52] U.S. Cl. ......................... 318/445; 318/478; 318/280; 318/283; 318/449; 318/479; 318/483; 318/489
[58] Field of Search .................... 318/478, 445, 318/280, 283, 449, 483, 489

[56] References Cited

U.S. PATENT DOCUMENTS

| 3,830,018 | 8/1974 | Arai et al. ................................. 318/478 |
| 5,661,385 | 8/1997 | McEwan ................................. 318/478 |

FOREIGN PATENT DOCUMENTS

| 60-110883 | 6/1985 | Japan ............................. E05F 15/16 |
| 61-104221 | 7/1986 | Japan ............................. B60J 1/17 |
| 5-321530 | 12/1993 | Japan ............................. E05F 15/10 |
| 6-335284 | 12/1994 | Japan ............................. H02P 7/06 |

Primary Examiner—Karen Masih
Attorney, Agent, or Firm—Junichi Mimura

[57] ABSTRACT

A pair of capacitors are provided at a window sash or a window glass edge. Each capacitor is connected to two variable phase delay generators in parallel. Selectors are inserted between the capacitors and variable phase delay generators. Each selector alternates the connection between the capacitor and two variable phase delay generators. Upon insertion of human bodies, two variable phase delay generators reverse relative phase delays of the output signal from the two variable phase delay generators. If one of the relative phase delays is reversed, the human bodies are detected to be inserted into the window opening.

16 Claims, 7 Drawing Sheets

SAFETY DEVICE FOR AUTOMOBILE POWER WINDOW SYSTEM

BACKGROUND OF THE INVENTION

1. Field of the Invention

This invention relates to a safety device suitable for an electrical power window apparatus, more particularly to an anti-pinching function of the power window apparatus.

2. Description of the Related Art

An anti-pinching- function is indispensable for power window apparatus in order to avoid risk of an serious accident to pinch human bodies between a window glass and a sash. In order to achieve this function, it is well known to detect human bodies inserted between the window glass and the sash, and stop or rotate in reverse the window regulator motor to keep the window glass from the detected human bodies. In order to the detection, four types of inventive technologies are already proposed.

First type of those technologies detects mechanical overload of the window regulator motor. In this type, the mechanical overload is detected by monitoring electrical overload of the motor drive current. An embodiment of the first type is disclosed in Japanese Patent Laid Open No. Hei 6-335284 for instance.

Second type of those technologies also detects mechanical overload. However, in this type, the mechanical overload is detected by monitoring not electrical overload but drive current pulse disorder of the regulator motor. An embodiment of the second type is disclosed in Japanese Patent Laid Open No. Hei 5-321530 for instance.

Third type of those technologies detects human bodies directly. In this type, a capacitor is elongated along the sash, and its capacitance is monitored by a monitoring circuit when the regulator motor is activated. In case human bodies are pinched between the window glass and the sash, the capacitor alters its capacitance caused by human bodies' capacitance, and the monitoring circuit detects that a pinching accident has occurred. An embodiment of the third type is disclosed in Japanese Utility model Laid Open No. Sho 61-104221 for instance.

And the fourth type of those technologies also detects human bodies directly. However, in this type, elongated along the sash is not a capacitor but a touch sensor. In case human bodies are pinched between the window glass and the sash, this touch sensor detects pressure despite the edge of the window glass does not reach the touch sensor yet. An embodiment of the fourth type is disclosed in Japanese Patent Laid Open No. Sho 60-119883 for instance.

Accordingly, the first type and the second type inevitably bring pain for the pinched human bodies. This pain is a result of the mechanical overload. So, the pain is unavoidable even if sensitivity of the detection is progressed. In addition, electrical property of the parts should be regulated to avoid ignorance or over-detection of human bodies. This regulation should be provided by each products to compensate variation of the parts, such as motor torque, sensor sensitivity, or occilate frequency. This regulation will bring serious disadvantage in productivity or cost because the regulation process consumes considerable labor.

Additionally in the third type, it is technically complicated to insert conductive terminal in the window glass edge to produce capacitor sensor, or it is also complicated or difficult to compensate change of the parts according to time passage, such as capacity drift.

Or in the fourth type, conductive terminals shall be provided at the window glass edge by baking, then a pressure-sensitive conductive rubber seat shall be sticked on the conductive terminals, and the surface of the pressure-sensitive conductive rubber seat shall be coated with sericone rubber. Accordingly, those structure or production process will be unavoidably become complicated, and glass coating print circuit will be indispensable to connect the capacitor terminals with other electrical circuit parts of the power window system.

SUMMARY OF THE INVENTION

In order to avoid the problems or technical and economical disadvantages as cited above, this invention provides an advanced power window system comprising a pair of capacitor suited along imaginary areas of a window of an automobile, a pulse generator which generates electric pulses of a determined frequency and phase, a pair of variable phase delay generators which delay the pulse phases from the pulse generator in response to relative capacity change of the capacitors, and phase comparator which detects relative phase difference of the pulse from the variable phase delay generators.

Utilizing the above mentioned structure, the capacitors change their capacities on insertion of human body, such as a head or an arm, according as how the body is included in the imaginary areas respectively. Then the variable phase delay generators delays the phases of the pulses generated by the pulse generator according to the changed capacities of the capacitors. Then the phase comparator compares the delayed phases of the pulses each other, and controls the drive current of the window motor to stop or reverse the window motor, and avoid pinching the inserted human bodies between the window glass and the window sash.

DESCRIPTION OF THE PREFFERED EMBODIMENT

Figure 1:
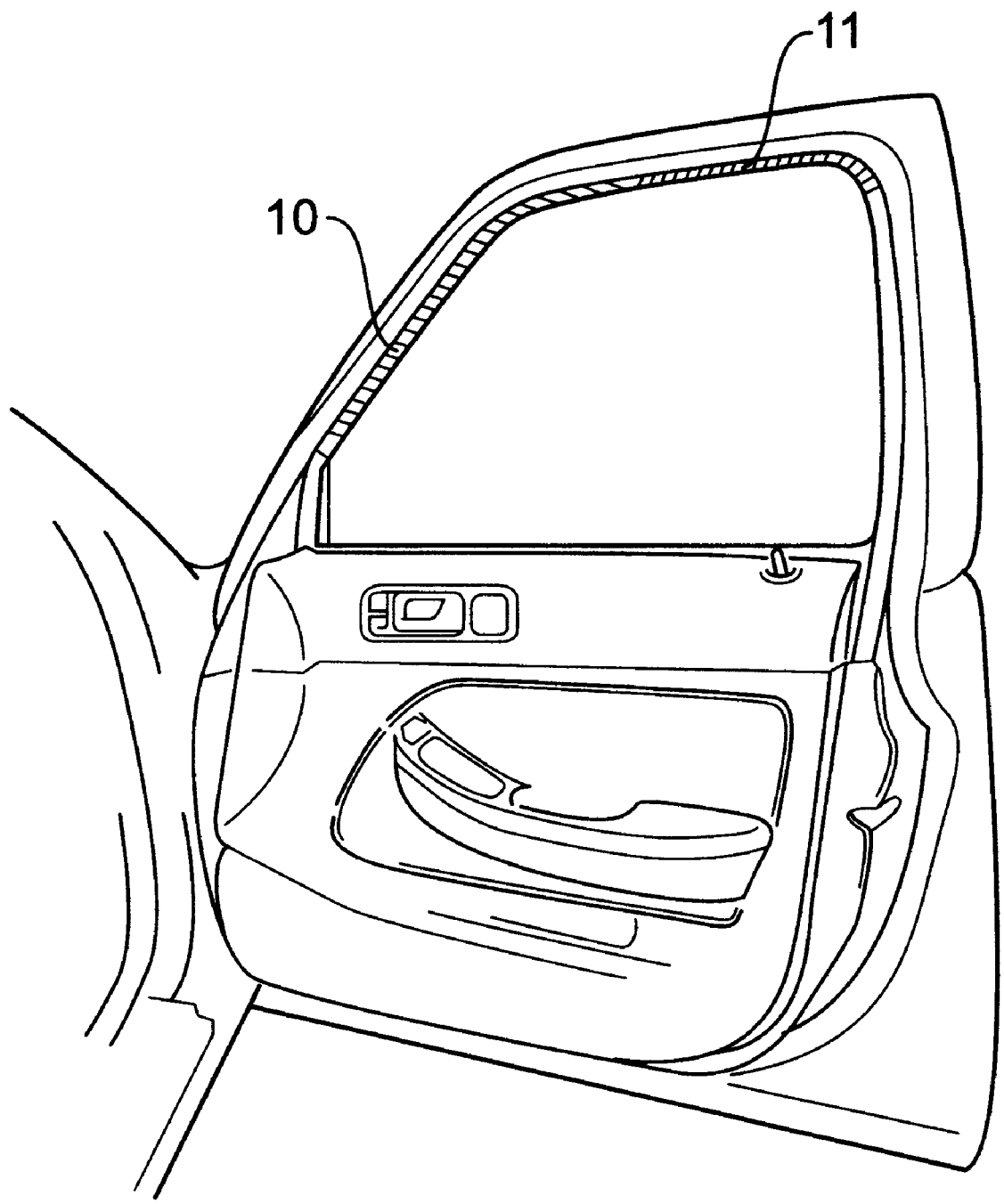
FIG. 1 shows an embodiment of terminals of the capacitors which are provided along the door window sash.

In FIG. 1, a capacitor 10 and another capacitor 11 are provided along a door window sash. Each capacitors 10 and 11 are consisted of a pair of terminals. These terminals are consisted of conductive films, and are glued on the edge of the window sash. As shown in FIG. 1, window opening is conceptually divided into two imaginary areas, by the capacitors 10 and 11, into the first area near door hinge and the second area near door catch. In case a human bodies is pinched at the first area, the capacitor 10 changes its capacity, and the capacitor 11 does not. On the contrary, if a human bodies is pinched at the second area, the capacitor 11 changes its capacity, and the capacitor 10 does not.

Figure 2:
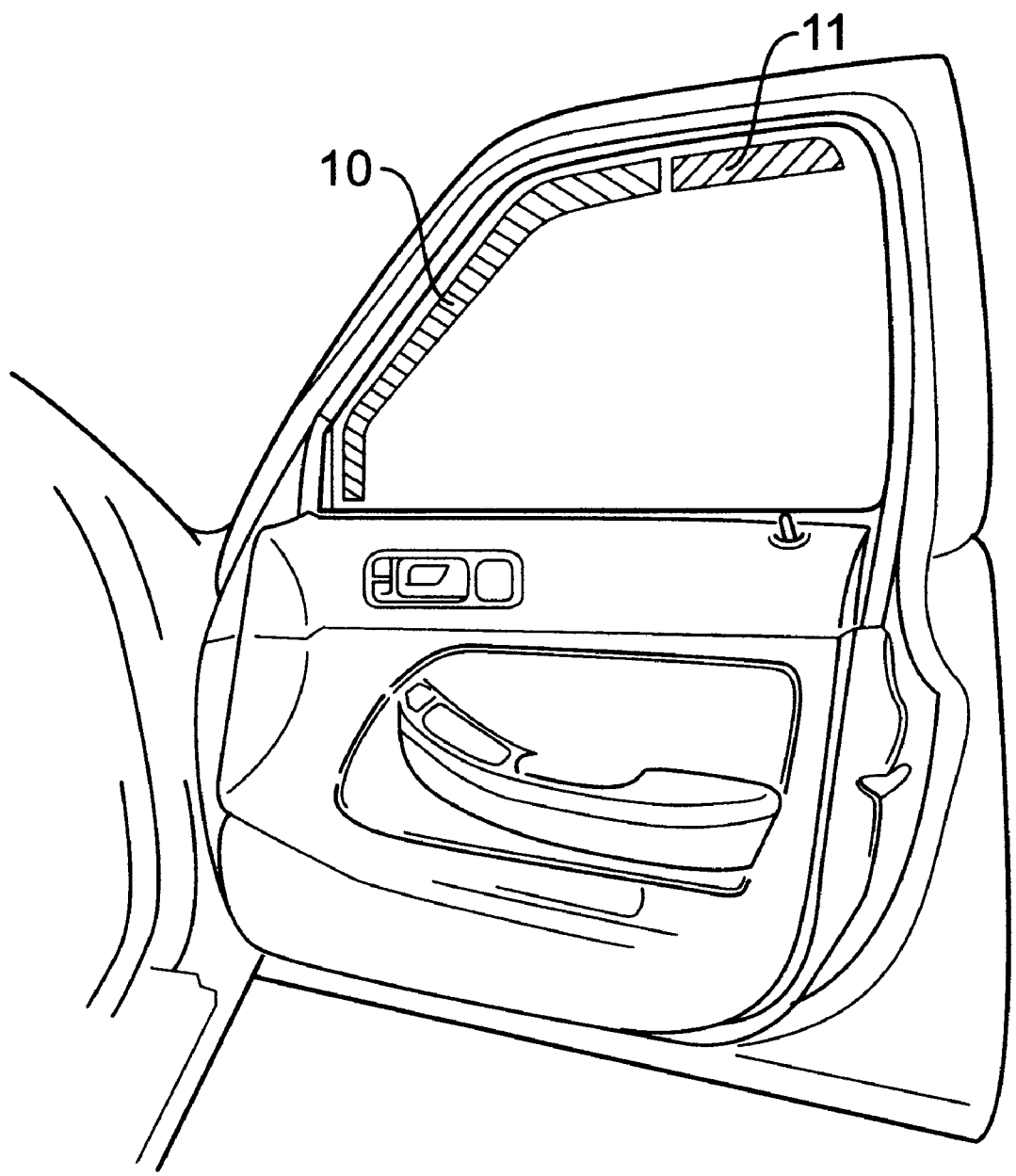
FIG. 2 shows an embodiment of terminals of the capacitors which are provided along the door window glass.

In FIG. 2, a capacitor 10 and another capacitor 11 are provided along a door window glass edge. In this structure of FIG. 2, each capacitors 10 and 11 are also consisted of a pair of terminals. These terminals are consisted of conductive films, and are glued on the edge of the window sash. As shown in FIG. 2, window opening is conceptually divided into two imaginary areas by the capacitors 10 and 11, into the first area near door hinge and the second area near door catch. In case a human bodies is pinched at the first area, the capacitor 10 changes its capacity, and the capacitor 11 does not. On the contrary, if a human bodies is pinched at the second area, the capacitor 11 changes its capacity, and the capacitor 10 does not.

Figure 3:
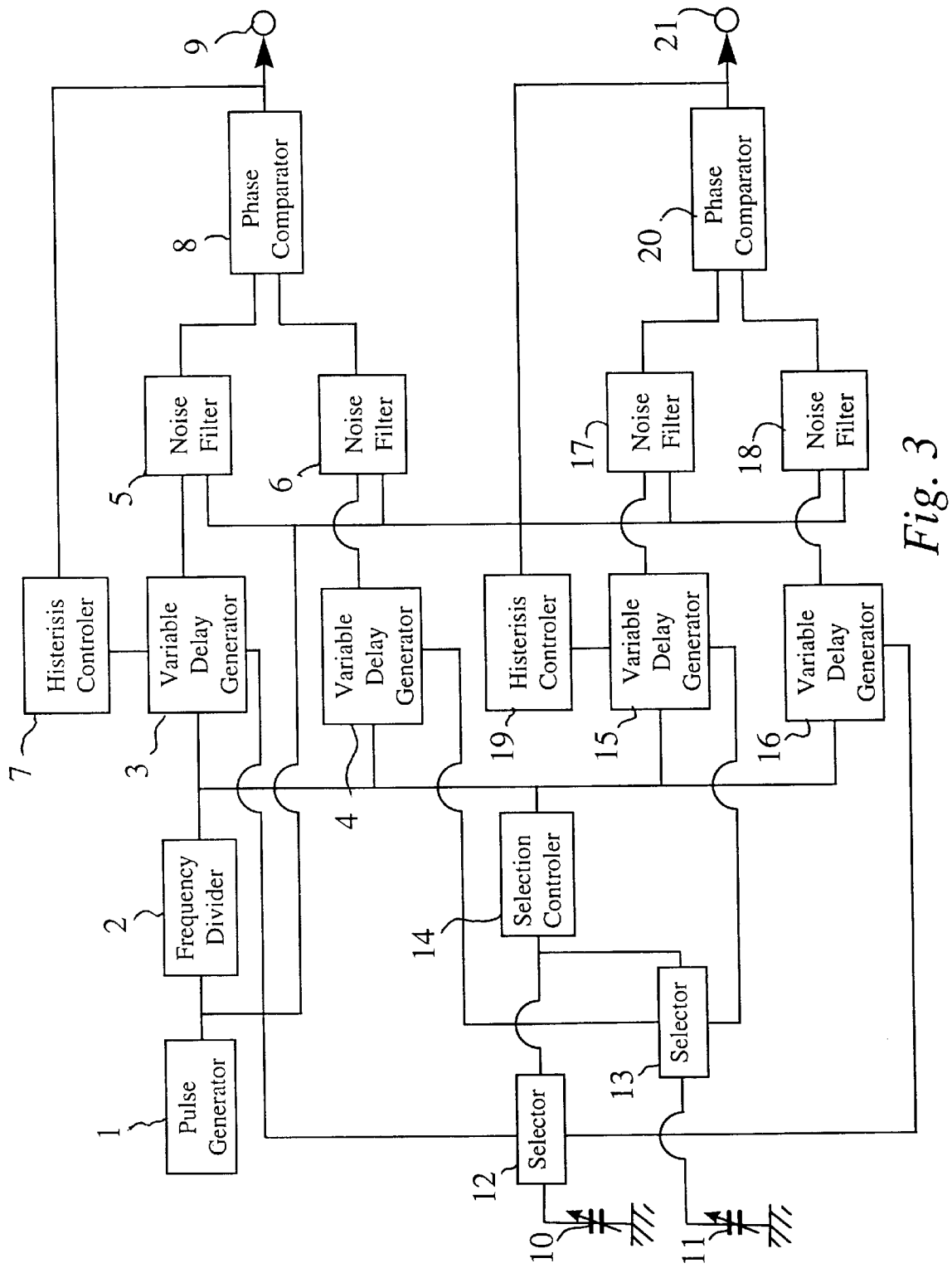
FIG. 3 shows a block diagram of circuit construction of the safety device cited in the preferred embodiment.
Figure 4:
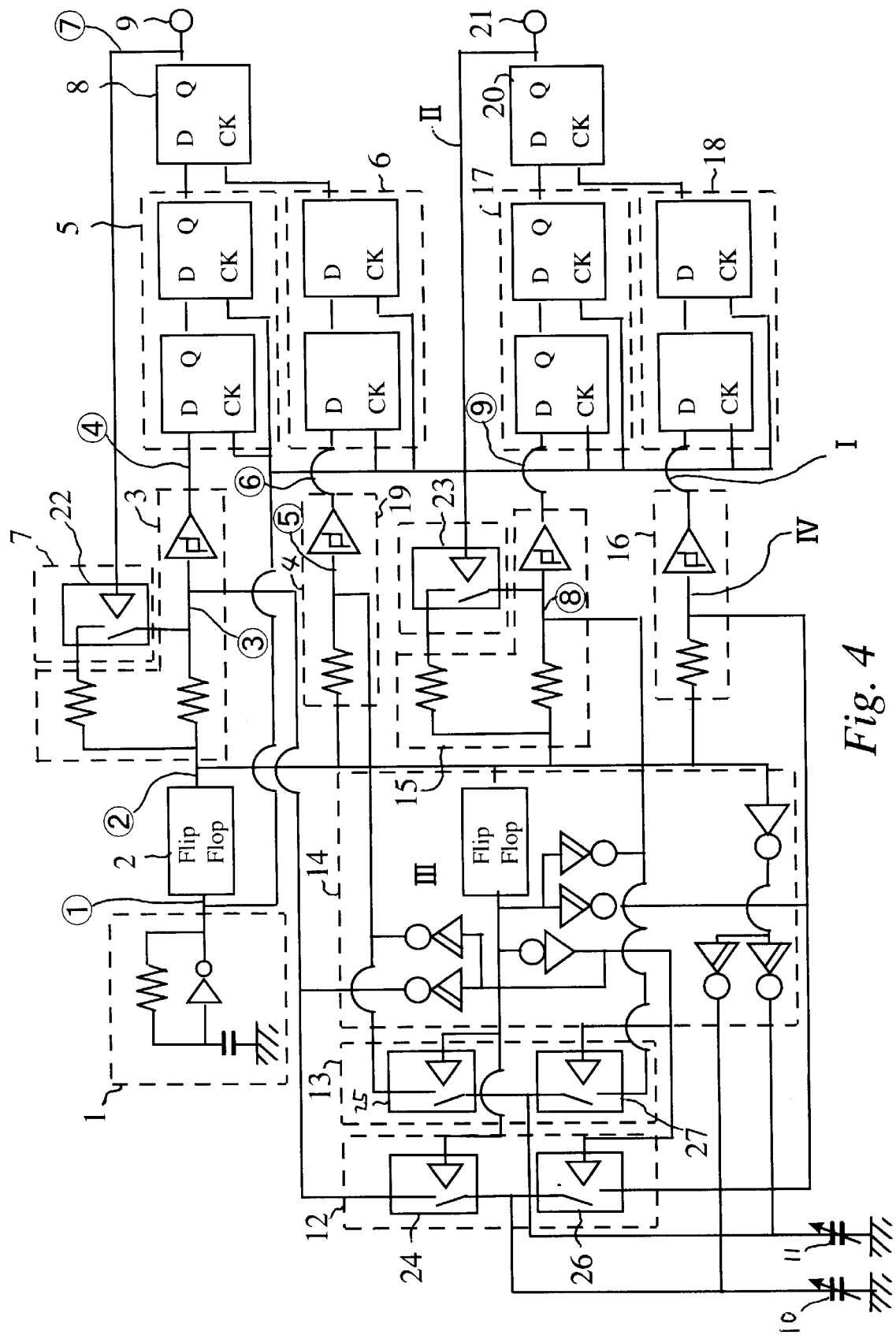
FIG. 4 shows a detailed circuit design of the safty device cited in the FIG. 3.

In FIG. 3, an preferable block diagram of a circuit structure of this invention is disclosed. In FIG. 4, a detailed circuit construction of the block diagram of FIG. 3 is disclosed.

In FIG. 3, 1 is a pulse generator. This pulse generator 1 is consisted of a resistor and an open corrector inverter being connected in parallel, and a capacitor being connected to those resistor and inverter in series.

2 is a frequency divider which transforms basic clock pulse into detection timing clock signals of lower frequency. This frequency divider is consisted of a flip-flop circuit as well known.

3, 4, 15, and 16 are variable phase delay generators. This variable phase delay generators are consisted of integral circuits and Schmidt circuits by each. The integral circuits are consisted of the capacitor 10 or 11 and resistors shown in FIG. 4. This variable phase delay generators delay phases of the detection timing signals being provided from the frequency divider 2 according to the capacity change of the capacitors 10 and 11.

Utilizing this construction, a pair of the variable phase delay generators 3 and 4 detects capacity change of the capacitor 10, and another pair of the variable phase delay generators 3 and 4 detects capacity change of the capacitor 11 In this circuit design, initial integral constant of the variable phase delay generator 3 should be greater than that of the variable phase delay generator 4 by a little in the safe condition that the capacitor 10 does not change its capacity by pinching human bodies. Similarly, initial integral constant of the variable phase delay generator 15 should be greater than that of the variable phase delay generator 16 by a little in the safe condition that the capacitor 11 does not change its capacity by pinching human bodies.

5, 6, 17, and 18 are well known noise filters. 12 and 13 are selectors. 14 is selection controller. 7 and 19 are histerisis controllers. 8 and 20 are phase comparators. 10 and 11 are capacitors as already shown in FIG. 1 and FIG. 2.

Pulse generator 1 generates basic clock pulse signal of a predetermined frequency and phase. The basic clock pulse is shown as ① in signal chart.

The basic clock signal is provided to frequency divider 2. The frequency divider 2 divides the basic clock signal into half frequency, and generates detection timing clock signal. The detection timing clock signal is shown as ② in signal chart.

The detection timing clock signal is delayed by variable phase delay generators 3, 4, 15, and 16 by each. The variable phase delay generators 3 and 4 delays pulse phase of the detection timing clock signal depending on the capacities of capacitors 10 and 11. The variable phase delay generators 3 and 4 delays pulse phase on the capacities of the capacitor 11, and The variable phase delay generators 15 and 16 delays pulse phase on the capacities of the capacitor 10.

The delay of the phase pulse depends on the capacity change of each capacitors. Accordingly the delay of the phase pulse changes depending on insertion of human bodies into the window opening.

On receiving the detection timing signal, selection controller 14 divides the pulses of the detection timing signal into two selectors 12 and 13. While the divided timing detection signal is provided, the selector 12 and 13 resume its connection from the capacitor 10 to the variable phase delay generators 3 and 16, or from the capacitor 11 to the variable phase delay generators 4 and 15.

Objectively, while the divided detection timing signal is provided to the selector 12, it resumes connection from the capacitor 10 to the variable phase delay generators 3 and 16 alternately. When the detection timing signal III is at high level, the selector 12 resumes connection from the capacitor 10 to the variable phase delay generator 3, and when the detection timing signal III is at low level, the selector 12 resumes connection from the capacitor 10 to the variable phase delay generator 16. Similarly, while the divided detection timing signal is provided into the selector 13, it resumes connection from the capacitor 11 to the variable phase delay generators 4 and 15. When the detection timing signal III is at high level, the selector 13 resumes connection from the capacitor 11 to the variable phase delay generator 4, and when the detection timing signal III is at low level, the selector 13 resumes connection from the capacitor 11 to the variable phase delay generator 15.

Figure 5:
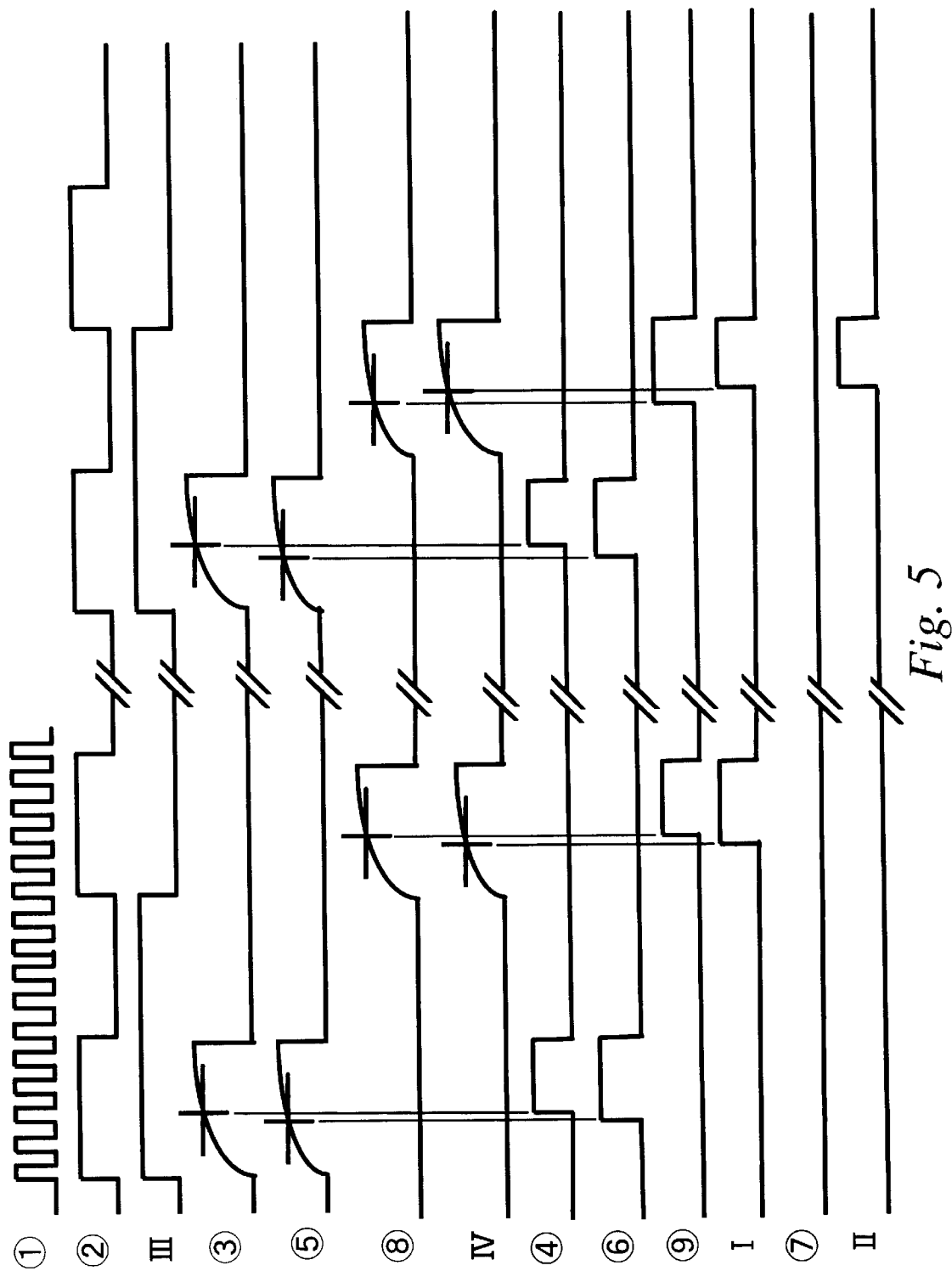
FIG. 5 shows a signal chart of in the circuit being disclosed in the FIG. 3 and FIG. 4, when a human bodiesa are inserted near the capacitor 11, which will be described below.
Figure 6:
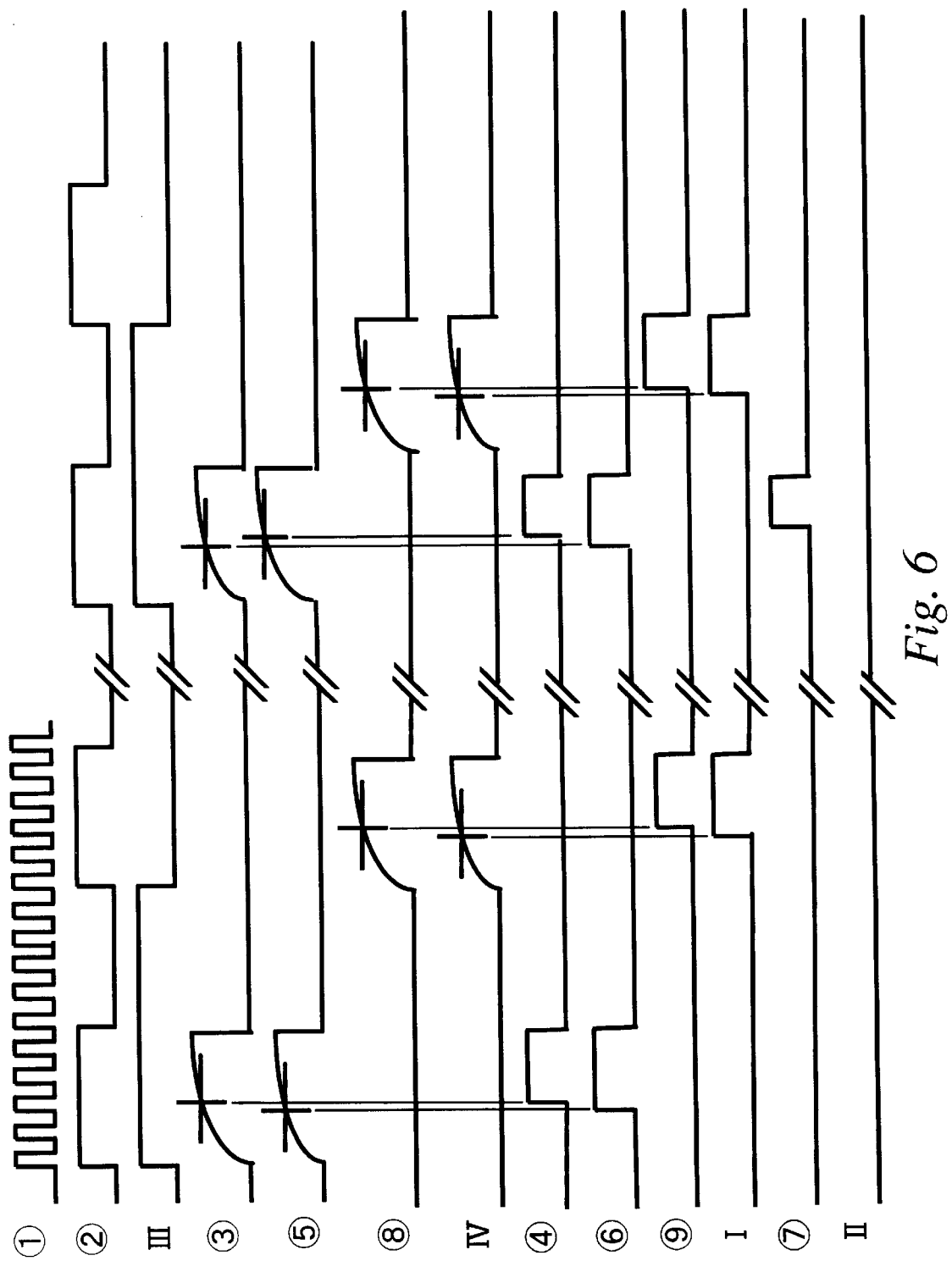
FIG. 6 also shows a signal chart of in the circuit being disclosed in the FIG. 3 and FIG. 4, when a human bodiesa are inserted near the capacitor 10, which will be described below.

Utilizing the above mentioned structure, the preferred embodiment works as shown in the signal chart in FIG. 5 and in FIG. 6. For the detailed explanation, an example of the circuit design is disclosed in FIG. 4.

As shown in the signal chart of FIG. 5, output signal III from the selection controller 14 becomes high level synchronizing the detection timing signal ②. On becoming high level of the output signal •, analog switch 24 in the selector 12 and analog switch 25 in the selector 13, each shown in FIG. 4 are energized. Then the capacitor 10 are connected to the variable phase delay generators 3, and the capacitor 11 are connected to the variable phase delay generators 4. Accordingly the variable phase delay generator 3 integrates input signal shown as ③ into integrated signal shown as ④. Similarly the variable phase delay generator 4 integrates input signal shown as ⑤ into integrated signal shown as ⑥. These signals ④ and ⑥ are delayed from the detection timing signal by a certain time period. The time period depends on the circuit design constant of the integral circuit of the variable phase delay generators 3 and 15.

Those signals ④ and ⑥ are each provided to the noise filter 5 and 6. Those noise filter 5 and 6 are consisted of first and second differential type flip-flop circuits connected in series, in order to extinguish impulse noise that has lower frequency than the detection timing signal ②. As shown in FIG. 4, the above cited variable phase delay generators 3 and 4 are connected to D input terminal of the first flip flop circuits. Q output terminals of the first flip flop circuits are connected to D input terminal of the second flip flop circuits. And the basic timing signals shown as ① are provided at the clock input terminal of each flip flop circuits. With those structure, output signals from the above cited variable phase delay generators 3 and 4 become stabled.

Then those stable output signals are provided to the phase comparator 8. The phase comparator 8 is consisted of one differential type flip-flop circuit. In the phase comparators 8, D terminal is connected to the variable phase delay generators 3, and clock terminal is connected to variable phase delay generators 4. Accordingly, the phase comparators 8 generates binary output signal depending on phase difference between output signals of the variable phase delay generators 3 and the variable phase delay generators 4. So the binary output signal of the phase comparator depends on the relative capacity difference of the capacitor 10 and that of the capacitor 11.

When the output signal III from the selection controller 14 becomes high level and the detection timing clock signal ② becomes high level, the selection controller 14 releases electricity being stored in the capacitors 10 and 11, and prepares the detection by the variable phase delay generators 15 and 16.

As shown in the signal chart of FIG. 5, output signal III from the selection controller 14 becomes low level synchronizing the detection timing signal ②. On becoming low level of the output signal III, analog switch 26 in the selector 12 and analog switch 27 in the selector 13, each shown in FIG. 4 are energized. Then the capacitor 10 are connected to the variable phase delay generators 3, and the capacitor 11 are connected to the variable phase delay generators 15. Accordingly the variable phase delay generator 15 integrates input signal shown as ⑧ into integrated signal shown as ⑨. Similarly the variable phase delay generator 16 integrates input signal shown as IV into integrated signal shown as I. These signals ⑨ and I are delayed from the detection timing signal by a certain time period. The time period depends on the circuit design constant of the integral circuit of the variable phase delay generators 4 and 16.

Similarly the variable phase delay generators 15 and 16 are connected to D input terminal of the first flip flop circuits. Q output terminals of the first flip flop circuits are connected to D input terminal of the second flip flop circuits. And the basic timing signals shown as ① are provided at the clock input terminal of each flip flop circuits. With those structure, output signals from the above cited variable phase delay generators 15 and 16 become stabled.

In the phase comparator 20, D terminal is connected to the variable phase delay generators 15, and clock terminal is connected to variable phase delay generators 16. Accordingly, the phase comparators 20 generates binary output signal depending on phase difference between output signals of the variable phase delay generators 15 and the variable phase delay generators 16. So the binary output signal of the phase comparator also depends on the relative capacity difference of the capacitor 10 and that of the capacitor 11.

If human bodies are kept from the window opening, output pulse signal from the noise filter 5 delays its phase than output pulse signal from the noise filter 6 because the variable phase delay generator 3 has greater integral constant than the variable phase delay generator 4. Accordingly the comparator 8 will not be energized, and output terminal 9 keeps low level. Similarly, If human bodies are kept from the window opening, output pulse signal from the noise filter 17 delays its phase than output pulse signal from the noise filter 18 because the variable phase delay generator 15 has greater integral constant than the variable phase delay generator 16. Accordingly the comparator 20 will not be energized, and output terminal 21 keeps low level.

Then the detection timing clock signal ② becomes low level, and the selection controller 14 releases electricity from capacitors 10 and 11. Then the whole system resumes to an initial detection condition.

In case human bodies are inserted in the window opening near the capacitor 11, as shown in FIG. 5, the capacity of the capacitor 11 becomes greater than that of the capacitor 10 because of the inserted human body capacity. Accordingly, on the contrary to the safe condition, the integral constant of the variable phase delay generators 4, which is connected to the capacitor 11 becomes greater than the integral constant of the variable phase delay generators 3, which is connected to the capacitor 10. On the other hand, for the same as the safe condition, the integral constant of the variable phase delay generators 15, which is connected to the capacitor 11 keeps greater than the integral constant of the variable phase delay generators 16, which is connected to the capacitor 10. So being provided with the detection timing signal pulse ②, phase of the signal ④ is relatively delayed than the signal ⑥ as shown in FIG. 5. These signals ④ and ⑥ of relatively different phase are provided to the phase comparator 8. As a result, the comparator 8 provides high level output signal at the terminal 9, while the comparator 20 keeps low level output signal at the terminal 21.

Similarly, in case human bodies are inserted in the window opening near the capacitor 10, as shown in FIG. 6, the capacity of the capacitor 10 becomes greater than that of the capacitor 11 because of the inserted human body capacity. Accordingly, on the contrary to the safe condition, the integral constant of the variable phase delay generators 16, which is connected to the capacitor 11 becomes greater than the integral constant of the variable phase delay generators 15, which is connected to the capacitor 11.

So being provided with the detection timing signal pulse ② phase of the signal ⑨ is relatively delayed than the signal I as shown in FIG. 5. These signals ⑨ and I of relatively different phase are provided to the phase comparator 20. As a result, the comparator 20 provides high level output signal at the terminal 21, while the comparator 20 keeps low level output signal at the terminal 20.

On the other hand, for the same as the safe condition, the integral constant of the variable phase delay generators 3, which is connected to the capacitor 10 keeps greater than the integral constant of the variable phase delay generators 4, which is connected to the capacitor 10.

As a result, the comparator 20 provides high level output signal at the terminal 21, while the comparator 8 keeps low level output signal at the terminal 9.

Figure 7:
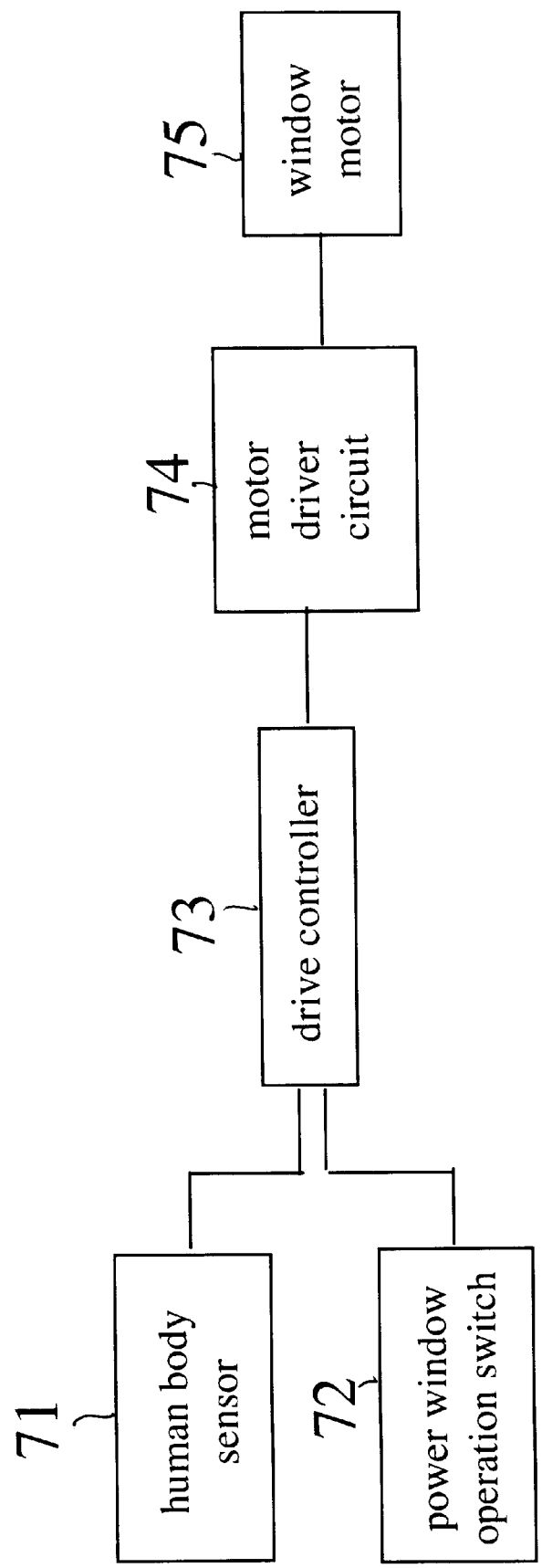
FIG. 7 shows a block diagram of the power window system which comprises the safety device of the present invention.

FIG. 7 shows a block diagram of an automobile power window system. In FIG. 7, 71 is a human body sensor portion as cited above, 72 is a power window operation switch portion suited for passenger's manual operation, 73 is a drive controller for controlling the motor according to the human body sensor portion, 74 is a motor driver circuit portion which generates drive current in response to the drive controller, and 75 is a window motor portion. The drive controller 73 controls the motor driver circuit 73 to stop the motor 75 in case the 71 detects that human bodies are inserted in the window opening while the motor 75 rotates to the direction which shuts the window. Or, it is applicable that the drive controller 73 controls not only stop the motor 75 but also reverse the motor 75 to keep the window edge from the inserted human bodies.

What is claimed is:

1. A safety device for automobile power window system comprising;
   a window motor;
   a first capacitor being provided at a window sash;
   a second capacitor being provided at a window sash;
   a pulse generator;
   a first variable phase delay generator which delays phase of the signal pulse received from the pulse generator depending on capacity of the first capacitor;
   a second variable phase delay generator which delays phase of the signal pulse received from the pulse generator depending on capacity of the first capacitor;
   a phase comparator which compares phases of the signals each provided by the first and second variable phase delay generators; and
   a motor controller which stops window motor when one of said phase comparator detects the phase delay are relatively reversed between the first variable phase delay generators or the second variable phase delay generators.

2. A safety device for automobile power window system comprising;
   a window motor;
   a first capacitor being provided at a window sash;
   a second capacitor being provided at a window sash;
   a pulse generator;
   a first variable phase delay generator which delays phase of the signal pulse received from the pulse generator depending on capacity of the first capacitor;
   a second variable phase delay generator which delays phase of the signal pulse received from the pulse generator depending on capacity of the first capacitor;
   a third variable phase delay generator which delays phase of the signal pulse received from the pulse generator depending on capacity of the first capacitor;
   a fourth variable phase delay generator which delays phase of the signal pulse received from the pulse generator depending on capacity of the first capacitor;
   a first phase comparator which compares phases of the signals each provided by the first and third variable phase delay generators;
   a second phase comparator which compares phases of the signals each provided by the second and fourth variable phase delay generators; and
   a motor controller which stops window motor when one of said phase comparator detects the phase delay are relatively reversed between the first variable phase delay generators or the second variable phase delay generators, or between the second variable phase delay generators or the fourth variable phase delay generators.

3. A safety device for automobile power window system as cited in claim 1, wherein
   at least one noise filter is inserted between the variable phase delay generators and the phase comparator.

4. A safety device for automobile power window system as cited in claim 1, wherein
   at least one noise filter is inserted between the variable phase delay generators and the phase comparators.

5. A safety device for automobile power window system as cited in claim 1, wherein
   the first capacitor is alternately connected to the first variable phase delay generator or the third variable phase delay generator.

6. A safety device for automobile power window system as cited in claim 1, wherein
   the second capacitor is alternately connected to the second variable phase delay generator or the fourth variable phase delay generator.

7. A safety device for automobile power window system as cited in claim 3, wherein
   the first capacitor is alternately connected to the first variable phase delay generator or the third variable phase delay generator.

8. A safety device for automobile power window system as cited in claim 3, wherein
   the second capacitor is alternately connected to the second variable phase delay generator or the fourth variable phase delay generator.

9. A safety device for automobile power window system comprising;
   a window motor;
   a first capacitor being provided at a window glass edge;
   a second capacitor being provided at a window glass edge;
   a pulse generator;
   a first variable phase delay generator which delays phase of the signal pulse received from the pulse generator depending on capacity of the first capacitor;
   a second variable phase delay generator which delays phase of the signal pulse received from the pulse generator depending on capacity of the first capacitor;
   a phase comparator which compares phases of the signals each provided by the first and second variable phase delay generators; and
   a motor controller which stops window motor when one of said phase comparator detects the phase delay are relatively reversed between the first variable phase delay generators or the second variable phase delay generators.

10. A safety device for automobile power window system comprising;
    a window motor;
    a first capacitor being provided at a window glass edge;
    a second capacitor being provided at a window glass edge;
    a pulse generator;
    a first variable phase delay generator which delays phase of the signal pulse received from the pulse generator depending on capacity of the first capacitor;
    a second variable phase delay generator which delays phase of the signal pulse received from the pulse generator depending on capacity of the first capacitor;
    a third variable phase delay generator which delays phase of the signal pulse received from the pulse generator depending on capacity of the first capacitor;
    a fourth variable phase delay generator which delays phase of the signal pulse received from the pulse generator depending on capacity of the first capacitor;
    a first phase comparator which compares phases of the signals each provided by the first and third variable phase delay generators;
    a second phase comparator which compares phases of the signals each provided by the second and fourth variable phase delay generators; and
    a motor controller which stops window motor when one of said phase comparator detects the phase delay are relatively reversed between the first variable phase delay generators or the second variable phase delay generators, or between the second variable phase delay generators or the fourth variable phase delay generators.

11. A safety device for automobile power window system as cited in claim 9, wherein at least one noise filter is inserted between the variable phase delay generators and the phase comparator.

12. A safety device for automobile power window system as cited in claim 8, wherein at least one noise filter is inserted between the variable phase delay generators and the phase comparators.

13. A safety device for automobile power window system as cited in claim 8, wherein the first capacitor is alternately connected to the first variable phase delay generator or the third variable phase delay generator.

14. A safety device for automobile power window system as cited in claim 8, wherein the second capacitor is alternately connected to the second variable phase delay generator or the fourth variable phase delay generator.

15. A safety device for automobile power window system as cited in claim 9, wherein the first capacitor is alternately connected to the first variable phase delay generator or the third variable phase delay generator.

16. A safety device for automobile power window system as cited in claim 9, wherein the second capacitor is alternately connected to the second variable phase delay generator or the fourth variable phase delay generator.

* * * * *